United States Patent
Nakazaki et al.

(10) Patent No.: US 6,801,113 B2
(45) Date of Patent: Oct. 5, 2004

(54) PROXIMITY SENSOR WITH IMPROVED POSITIONING ACCURACY FOR DETECTION COIL PERIPHERAL MEMBERS

(75) Inventors: Takao Nakazaki, Takatsuki (JP); Mitsuo Hatada, Ayabe (JP); Koro Kitajima, Suita (JP); Hiroyuki Tsuchida, Ayabe (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/464,869

(22) Filed: Jun. 19, 2003

(65) Prior Publication Data

US 2004/0008102 A1 Jan. 15, 2004

(30) Foreign Application Priority Data

Jun. 21, 2002 (JP) .................................. P2002-181126

(51) Int. Cl.⁷ .............................................. H01F 27/30
(52) U.S. Cl. ..................... 336/198; 336/90; 336/221; 324/207.16
(58) Field of Search .................... 336/65, 90, 196–199, 336/208, 221; 324/207.11–17, 207.26–27, 234–236

(56) References Cited

U.S. PATENT DOCUMENTS

| | | | | |
|---|---|---|---|---|
| 3,281,744 A | * | 10/1966 | Melanson | .................... 336/65 |
| 3,368,177 A | * | 2/1968 | Hilgers | ........................ 336/208 |
| 3,743,853 A | * | 7/1973 | Dittman et al. | ............. 307/116 |
| 4,728,919 A | * | 3/1988 | Dirmeyer | ...................... 336/92 |
| 5,485,135 A | * | 1/1996 | Hipp | ............................ 336/96 |
| 5,523,734 A | * | 6/1996 | Beck et al. | ................. 336/185 |
| 5,814,986 A | * | 9/1998 | Goskowicz et al. | ... 324/207.26 |

FOREIGN PATENT DOCUMENTS

| | | | |
|---|---|---|---|
| JP | 61-149820 | * | 7/1986 |
| JP | 64-21939 U | | 2/1989 |
| JP | 1-152431 U | | 10/1989 |
| JP | 3-99305 U | | 10/1991 |

* cited by examiner

*Primary Examiner*—Tuyen T. Nguyen
(74) *Attorney, Agent, or Firm*—Foley & Lardner LLP (57) ABSTRACT

A proximity sensor according to the present invention includes protrusions that are provided on a wire-winding drum of a coil spool around which a lead wire of a detection coil is wound, that protrude toward the center from not less than three points distributed in the range exceeding a semi-circle on the circumference of the wire-winding drum and that are elastically brought into contact with the shaft of the core, respectively, thereby coaxially positioning the coil spool and the shaft of the core.

7 Claims, 12 Drawing Sheets

PROXIMITY SENSOR WITH IMPROVED POSITIONING ACCURACY FOR DETECTION COIL PERIPHERAL MEMBERS

BACKGROUND OF THE INVENTION

1. Field of the Invention

The present invention relates to a high frequency oscillation type proximity sensor and, more particularly, to a proximity sensor having a feature in that a positioning structure for a coil spool and a core is characteristic. The present invention also relates to an assembling method of the coil spool and the core of the proximity sensor.

2. Description of the Related Art

In a high frequency oscillation type proximity switch, it is necessary to set deviations in detection characteristic, typically represented by the detection distance, between products to a value not more than a specific value. In order to make the deviations in detection characteristic smaller, in most cases, circuit adjustments are carried out by using a variable resistor or the like during the assembling processes of the product; however, by making deviations in the positions of the members on the periphery of the detection coil such as a coil spool, a core and a coil case smaller, it is possible to narrow the adjusting range of the circuit or to eliminate the adjustments of the circuit.

The core is formed by sintering ferrite powder that has been molded, and since the powder shrinks by 10 to 20% during the sintering, it is difficult to improve the dimension precision. Therefore, in the case when positioning is carried out by using a simple fitting structure between the core and the coil spool or between the core and the coil case, since it is necessary to provide a gap-fitting structure with a margin, it is not possible to achieve positioning between members on the periphery of the detection coil with high accuracy. In addition, with respect to the members on the periphery of the detection coil, it is desirable not only to simply provide a positioning process with high accuracy, but also to provide a preferable assembling workability. The following documents relate to the positioning and the assembling workability of the members on the periphery of the detection coil of a proximity switch.

In the proximity switch disclosed in Japanese Unexamined Utility Model Publication No. 64-21939, in order to ensure the mechanical coupling between a bobbin (coil spool) and a core and also to provide an attaching device that achieves excellent workability and makes deformation of the bobbin smaller, an elastic bridge portion is formed on the cylinder portion of the bobbin, and a protrusion that is elastically brought into contact with the center portion of the core is formed at the intermediate portion of the bridge portion. However, in the embodiment shown in the figure, since two-point contacts are made between the protrusion of the bridge portion and the center portion of the core, it is not possible to ensure a coaxial structure between the bobbin and the core, and the bobbin axis tends to tilt from the core axis. Moreover, no consideration is given to the positioning in the axial direction with high accuracy.

With respect to the assembling method for a proximity switch, Japanese Unexamined Utility Model Publication No. 3-99305 has disclosed a method in which the flange face of a coil bobbin is placed on a flat plate and this is covered with a ferrite magnetic core (core), so that the flange face of the coil bobbin and the end face of the ferrite magnetic core are placed onto the same face. In this method, however, it is not possible to ensure the coaxial property between the coil bobbin and the ferrite magnetic core, and the assembling uses a bonding agent that is placed with a volume, and cured, thereby failing to provide a method with high productivity.

In the proximity switch disclosed in Japanese Unexamined Utility Model Publication No. 1-152431, an extended portion that is extended in the diameter direction is formed on the flange of the detection end side of the coil spool, and a step portion that is the same as the thickness of the extended portion is formed on the end face of the core side leg portion (circumferential wall portion); thus, the end face of the detection-end side of the coil spool and the end face of the core side leg portion are positioned on the same face. In this arrangement, however, it is not possible to ensure the coaxial property of the coil spool and the core as well as the coaxial property of the core and the coil case.

In none of the above-mentioned conventional techniques, it is not possible to simultaneously ensure the mutual coaxial property of the core, coil spool and coil case and the positioning in the axial direction thereof with sufficiently high accuracy.

SUMMARY OF THE INVENTION

It is an object of the present invention to provide: a high-frequency oscillation type proximity sensor having small deviations among products in detection property and having excellent assembling workability because of small mutual positional deviations of at least a core and coil spool, more preferably, small mutual positional deviations among members including a coil case in addition to these; a detection end module used therefor; and an assembling method of a coil spool a core used therefor.

A proximity sensor according to the present invention includes: a detection coil; a detection circuit including an oscillation circuit having the detection coil as a resonance circuit element; a coil spool including a hollow cylindrical wire-winding drum around which a lead wire of the detection coil is wound, a detection-side flange provided on a detection side end of the wire-winding drum, and a circuit side flange provided on the detection circuit side end of the wire-winding drum; a core, made of a magnetic member, including a shaft inserted into the wire-winding drum of the coil spool, and a plate-shaped base located between the coil spool and the detection circuit; a cylindrical coil case housing the coil spool and the core and having a bottom on the detection side end; and a main body case, fitted to the coil case, for housing the detection circuit, wherein the wire-winding drum of the coil spool includes protrusions that protrude toward the center from not less than three points distributed in the range exceeding a semi-circle on the circumference of the wire-winding drum and that are elastically brought into contact with a shaft of the core, respectively, thereby coaxially positioning the coil spool and the shaft of the core.

According to the present invention, the elastic contact between the protrusion of the coil spool and the shaft of the core makes it possible to coaxially position the coil spool and the core. It is preferable to position all the coil spool, core and the main body case (or the coil case to be fitted to the main body case) mutually without deviations; however, since the coaxial property of the coil spool and the core gives more influences to the detection property of the proximity sensor rather than to the positional relationship between these and the main body case, even achieving only the coaxial property makes it possible to limit deviations in detection characteristics among the products to a considerably small range. In addition, even combining only the coil spool and the core through an elastic contact makes it possible to achieve the coaxial property, and this position-determined state is maintained even until the time at which it has been finally cured by resin; therefore, it becomes possible to eliminate the coating process of an adhesive agent and the stand-by process for the curing so as to maintain the position-determined state, and consequently to provide a superior assembling workability.

In addition to a proximity switch for outputting a binary signal corresponding to the presence or absence of object detection, the proximity sensor herein includes of which outputs an analog signal corresponding to the intensity of the object detection and a digital signal formed by encoding this signal, and those which outputs the resulting signal obtained by subjecting these to any signal treatment. The intensity of the object detection varies when any of the distance to an object, the size of the object and the material of the object vary.

This proximity sensor preferably has a shape that applies a force to the shaft of the core at positions that are dispersed along the axial direction.

Herein, the application of a force to the shaft of the core at positions that are dispersed along the axial direction refers to a case where the positions of the core shaft at which the force is applied are dispersed at such positions that can prevent the tilt of the core shaft to the coil spool even when an external force is applied, and includes a case where the number of positions at which the force is applied is not less than two in addition to a case where the entire portion having a certain length along the axial direction of the protrusion applies a force to the core shaft. Here, the positions at which a force is applied may be located at different levels by the protrusion. Another arrangement may be formed in which, although the position at which any of the protrusions apply a force is only one position, when protrusions of not less than three are viewed as a whole, a force is applied to the shaft at positions of not less than two in the axial direction.

In this proximity sensor, the core may further include a circumferential wall covering the outer periphery of the detection coil, and the detection-side flange of the coil spool and the inner face of the cylinder portion of the coil case may be fitted to each other.

The proximity sensor, provided with the circumferential wall portion in the core, is referred to as a sealed type. By fitting these to each other, the coil spool and the coil case are positioned with respect to the center axis and the vertical direction. The expression, "fitted to each other", refers to a state where the gap is so small that the positioning is achieved or a state where two members are fitted to each other without a gap. Since the coaxial property between the coil case and the core has already been achieved, the positioning among the core, the coil case and the main body case is also achieved without deviations in the axis and the vertical direction.

When the detection-side flange of the coil spool can be positioned through a fitting operation to the coil case, it is sufficient for a portion thereof to be associated with the fitting operation. When the tubular portion of the coil case has a cylindrical shape, the detection-side flange may be set to a round shape or a shape other than the round shape. In the case when the detection-side flange does not have a round shape, a portion that is coincident with the circumscribing circle of the detection-side flange is fitted to the cylinder shape portion of the coil case. In this case, the portion of the detection-side flange relating to the fitting operation is distributed to not less than three positions covering a range exceeding the semicircle thereof.

Such a portion relating to the fitting operation is exemplified by an arm installed in a manner so as to stick out from the outer circumferential portion of the detection-side flange of the coil spool. In this case, the circumferential wall portion of the core is designed to have a concave portion having a depth corresponding to the thickness of the arm with the arm passing through the concave portion.

This concave portion may be used as a positioning reference in the core axial direction with respect to the coil spool, or a stopper which prevents the positioning between the coil spool and the core that have the respective detection-side end faces as the identical face from offsetting greatly.

In another aspect of the proximity sensor of this invention, the circuit-side flange of the coil spool is fitted to the inner face of the tubular portion of the coil case, and the detection-side flange of the coil spool can be set to a gap-fitting state with a margin to the inner face of the tubular portion of the coil case.

In this case, the proximity sensor is referred to as a non-sealed type without the circumferential wall in the core. In this type, when the main body case is made of metal, a coil case made of resin is generally allowed to protrude from the main body case with no metal case being located on the side face of the coil. Since there is no circumferential wall in the core, it is possible to fit the circuit-side flange of the coil spool to the coil case. In this case, provision may be made so as to also fit the detection-side flange of the coil spool to the coil case; however, this arrangement makes the resistance greater when the coil spool is inserted into the coil case. Therefore, the detection-side flange is formed into a shape and a size that provide a sufficient gap to the coil case so that it becomes possible to easily insert the coil spool into the coil case, and consequently to improve the assembling workability.

In the proximity sensor in this case, it is preferable to allow a portion of the outer circumference of the circuit-side flange to devote to the fitting operation to the coil case. Thus, it is possible to provide a sufficient gap to the coil case inner face in the other portion of the outer circumference of the circuit-side flange so that resin to be injected to the coil case is allowed to flow into the detection coil side through this gap.

A detection-end module for use in a proximity sensor according to the present invention includes: a detection coil; a detection circuit assembly including an oscillation circuit having the detection coil as a resonance circuit element; a coil spool including a hollow cylindrical wire-winding drum around which a lead wire of the detection coil is wound, a detection-side flange provided on a detection side end of the wire-winding drum, and a circuit side flange provided on the detection circuit side end of the wire-winding drum; and a core, made of a magnetic member, including a shaft inserted into the wire-winding drum of the coil spool, and a plate-shaped base located between the coil spool and the detection circuit; a cylindrical coil case housing the coil spool and the core and having a bottom on the detection side end, the members being integrally formed therein. The wire-winding drum of the coil spool includes protrusions that protrude toward the center from not less than three points distributed in the range exceeding a semi-circle on the circumference of the wire-winding drum and that are elastically brought into contact with a shaft of the core, respectively, thereby coaxially positioning the coil spool and the shaft of the core. The detection circuit assembly is designed so as to externally output a signal having a predetermined shape corresponding to the oscillation state of the oscillation circuit as an object detection signal of the proximity sensor.

According to this detection end module, since the coaxial property between the coil spool and the core is high, the necessity of adjustments in detection characteristics of the circuit becomes smaller correspondingly, and the application of this makes it possible to simplify the circuit structure of the proximity sensor and also to improve the productivity thereof. The detection end module of this type can be preferably put into the market independently as a part to be used for manufacturing the proximity sensor.

A coil spool and a core to be used in the proximity sensor according to the present invention can be assembled through the following steps by using a mounting base having a reference face and a pilot pin capable of reciprocally moving through the mounting base. In a first step, the pilot pin protruding from the mounting base is inserted into the wire-winding drum of the coil spool in such a manner as to direct the detection-side flange of the coil spool toward the reference face of the mounting base. In a second step, the pilot pin is pulled out from the coil spool while the detection-side flange of the coil spool is brought into contact with the reference face of the mounting base and, also, the shaft of the core is inserted into the coil spool in place of the pilot pin. In a third process, a relative position of the coil spool and the core is determined by bringing the detection-side end face of the core into contact with the reference face of the mounting base.

According to this method, the assembling can be carried out by easily aligning the end face of the coil spool and the end face of the core on the same plane. In addition, the application of the pilot pin makes it possible to easily insert the shaft of the core into the coil spool without causing any chipping or abrasion in the core shaft.

BRIEF DESCRIPTION OF THE DRAWINGS

FIGS. 7(1) to 7(5) illustrate an assembling method of the coil spool and the core;

DESCRIPTION OF THE PREFERRED EMBODIMENTS

Figure 1:
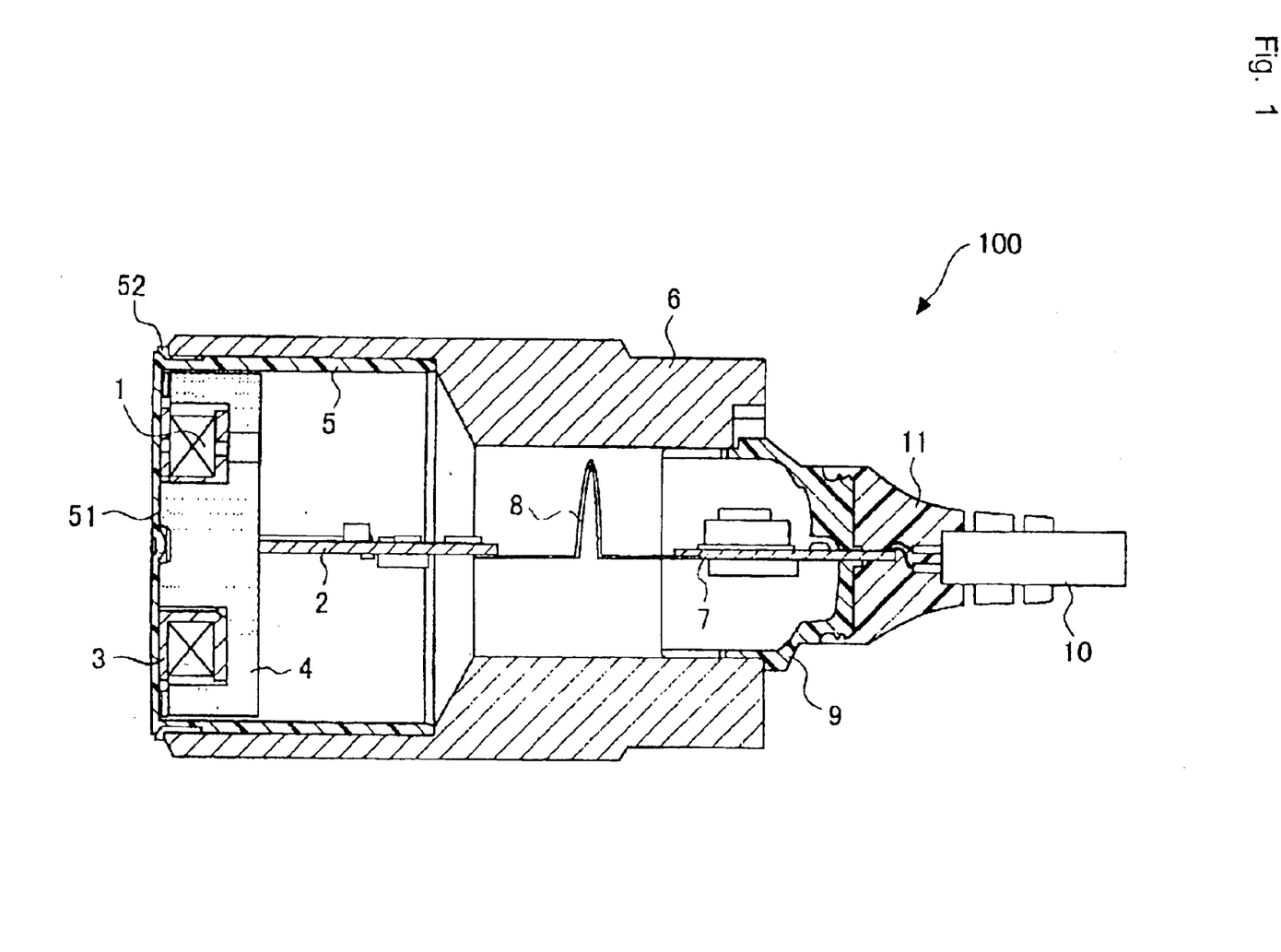
FIG. 1 is a cross-sectional view showing a proximity sensor according to an embodiment of the present invention.

FIG. 1 shows a cross section of a columnar proximity sensor 100 that is an embodiment of the present invention. A detection coil 1 has a lead wire connected to a detection circuit mounted on a substrate of a detection circuit assembly 2. The detection circuit includes an oscillation circuit having the detection coil 1 as a resonance circuit element. The detection coil 1 is wound around a coil spool 3. The detection coil 1 and the coil spool 3 are surrounded by a core 4 except for the detection side thereof (left side in the figure). That is, this proximity sensor 100 is of a sealed type in which the core 4 further covers the circumferential side face of the detection coil 1. The detection coil 1, the coil spool 3 and the core 4 are housed in a cylindrical coil case 5 with a bottom that is a resin molded product, and the detection sides thereof are covered with a bottom face 51 of the coil case 5. In addition, a metallic ring 52 having a L-shape in its cross-section is provided on the outer periphery on the bottom face 51 side of the coil case 5. The coil case 5 is press-inserted into a metallic main body case 6 with threads being formed on the outer periphery thereof, so that the ring 52 is butted against the end face of the detection side of the main body case 6.

In this proximity sensor 100, the detection circuit assembly 2 outputs a signal having a fixed shape in accordance with the oscillation state of the oscillation circuit mounted thereon as an object detection signal. An output circuit assembly 7 which, upon receipt of the object detection signal, converts the signal to an output signal having an appropriate shape and outputs the resulting signal out of the proximity sensor is provided by using a mounting substrate that is different from that of the detection circuit assembly 2. The detection circuit assembly 2 and the output circuit assembly 7 are electrically connected to each other through a flexible substrate 8. The output circuit assembly 7 is clamped and supported by a cord clamp 9 that is press-inserted into the main body case 6. A part of the output circuit assembly 7 protrudes out from the cord clamp 9, and a lead wire of a cord 10 is soldered thereto. This soldered portion is protected by a protector 11 formed by resin molding in such a manner as to bury the corresponding portion. The hollow portion inside the main body case 6 is filled with resin.

The coil case 5, the detection coil 1, coil spool 3 and core 4 housed therein and the detection circuit assembly 2 are integrally formed into a detection end module by solidifying the inside of the coil case 5 with a primary injection resin, before the flexible substrate 8 is connected to the detection circuit assembly 2. When a high frequency oscillation current flows into the detection coil 1, an ac magnetic field is generated on the periphery thereof, whereby an eddy current is generated in the ring 52 of the coil case 5. The magnetic field generated by this eddy current prevents the magnetic field by the detection coil 1 outside the ring 52 from generating with the result that the eddy current is no longer generated in the main body case 6. Therefore, there is hardly any change in the detection characteristic before and after attachment of the main body case 6. Accordingly, the detection end module makes it possible to adjust the final detection characteristic in its unattached state to the main body case 6. Because of this advantage, this detection end module is suitably put into the market as an independent intermediate product.

Description will briefly given of the assembling procedures after formation of the detection end module. The output circuit assembly 7 is connected to the detection circuit assembly 2 through the flexible substrate 8. The coil case 5 is press-inserted into the main body case 6. The cord clamp 9 is press-inserted into the main body case 6 and, also, the output circuit assembly 7 is secured by the cord clamp through heat caulking. After that, the hollow portion of the main body case is filled with resin that is supplied through a hole formed in the cord clamp 9, and the resin is cured. Subsequently, the cord 10 is soldered and the protector 11 is molded, so that a proximity sensor 100 is completed.

Figure 2:
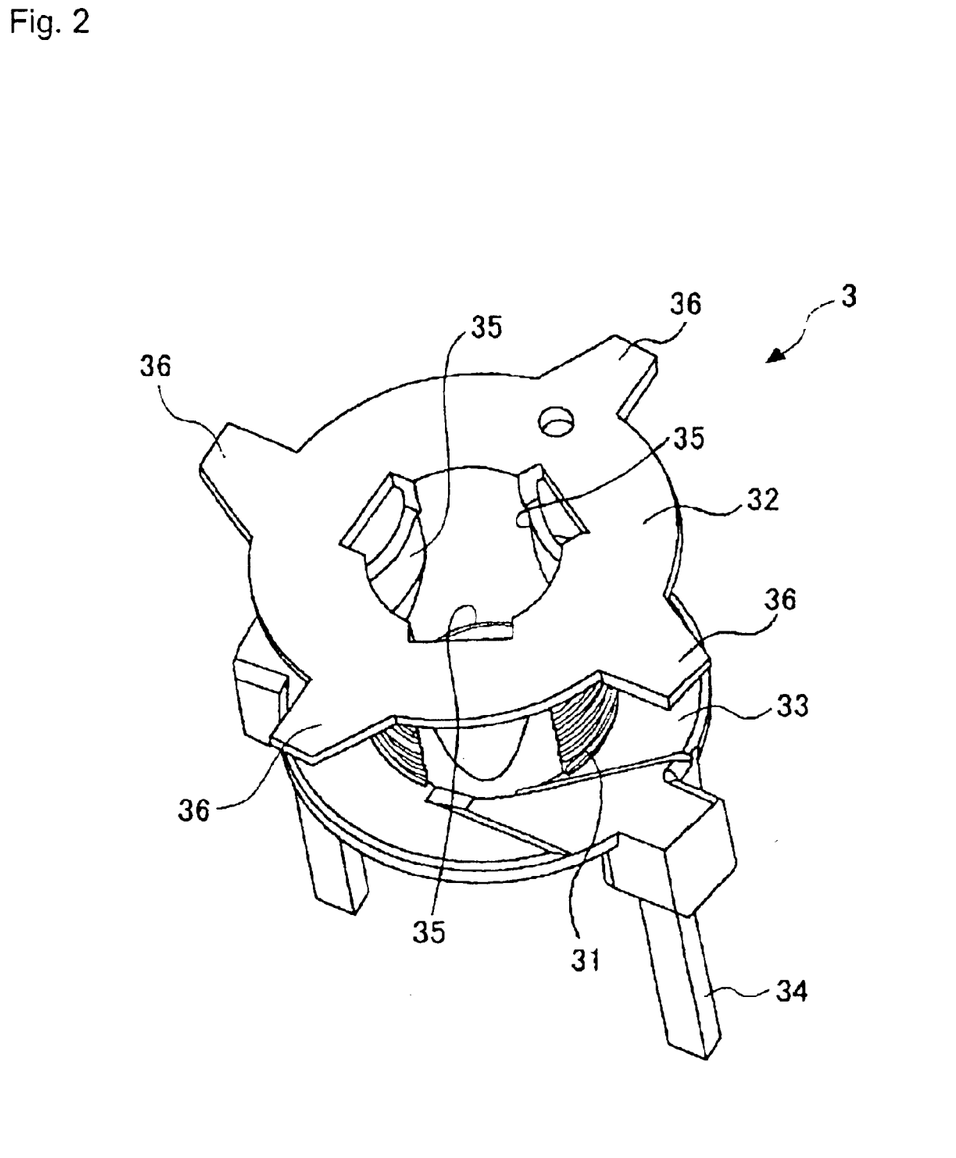
FIG. 2 is a perspective view showing a coil spool.
Figure 3:
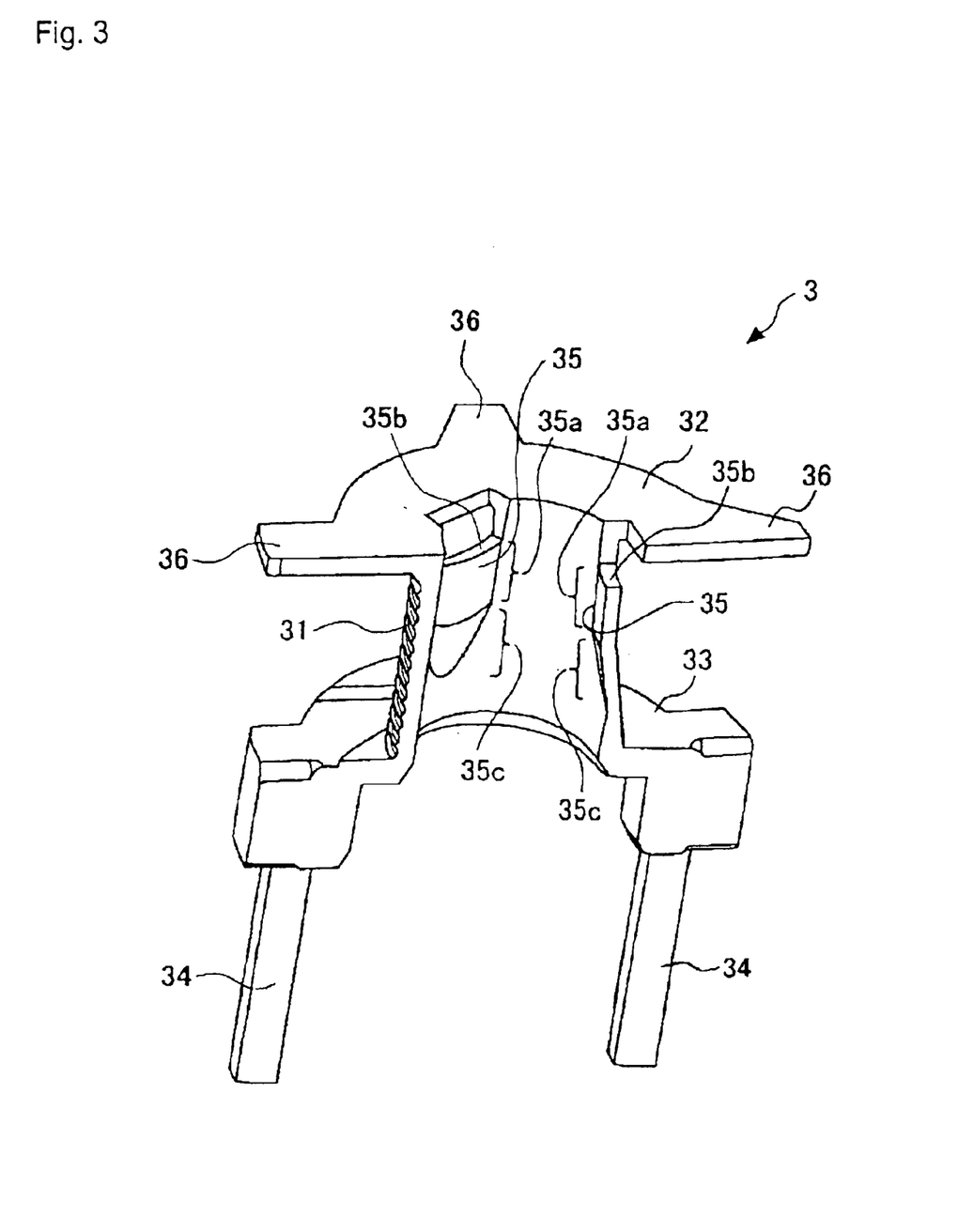
FIG. 3 is a perspective cross-sectional view of the coil spool.

FIG. 2 is a perspective view of the coil spool 3, and FIG. 3 is a perspective view showing its cross section. The coil spool 3 includes: a cylindrical wire-winding drum 31 around which the lead wire of the detection coil 1 is wound; a detection-side flange 32 provided on the detection-side end portion of the wire-winding drum 31; and a circuit-side flange 33 provided on the detection circuit-side end portion of the wire-winding drum 31. A circuit-securing pin 34 is provided on the circuit-side flange 33, and the substrate of the detection circuit assembly is soldered to the circuit-securing pin 34, and secured thereto. The coil spool 3 is entirely integrally molded by resin except that the metallic circuit-securing pin 34 is insert-molded.

The wire-winding drum 31 is provided with grooves for aligning the lead wire of the detection coil 1 and start winding the lead wire. In addition, protrusions 35 are provided on three points placed with equal distance on the circumference of the wire-winding drum 31, and protrude toward the center axis of the coil spool 3, respectively. Each of the protrusions 35 has a curved wall shape that protrudes in such a manner as to curve inward at a portion 35a on the detection side from the approximately center in the axial direction of the coil spool 3, and its end on the detection side forms a free end 35b that is not regulated, so that the protrusion 35 (in particular, its detection side portion 35a) is elastically deformed easily. Each of the protrusions 35 forms a slope face that tilts with respect to the center axis of the coil spool 3 at a portion 35c on the circuit side from the approximately center in the axial direction of the coil spool 3, so that the detection-side portion 35a of the protrusion 35 is connected to the inner face of the other wire-winding drum 31 that forms a cylinder shape.

From the outer periphery of the detection-side flange 32, arms 36 are provided in such a manner as to protrude in four directions with equal distance. The center of the circle which circumscribes the tip of each of the arms 36 is coincident with the center axis (the center axis of the wire-winding drum 31, i.e., the center axis of the detection coil 1) of the coil spool 3.

Figure 4:
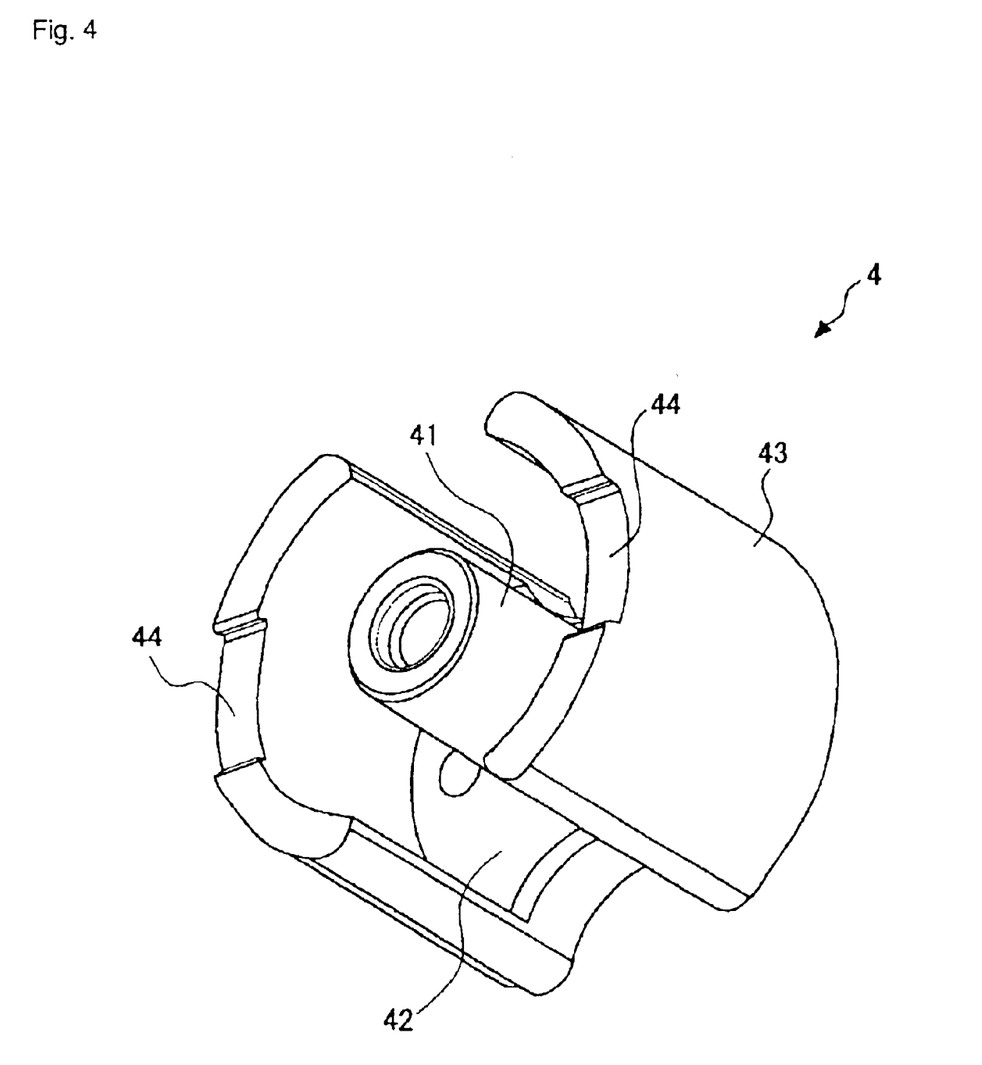
FIG. 4 is a perspective view of a core.

FIG. 4 is a perspective view showing a core 4. The core 4 includes: a shaft 41 to be inserted into the wire-winding drum 31 of the coil spool 3; a plate-shaped base 42 positioned between the coil spool 3 and the detection circuit assembly 2; and two circumferential walls 43 covering the outer periphery of the detection coil 1. The core 4 is made of ferrite. The end face of the shaft 41 and the end face of each circumferential wall 43 are located on the same face. Concave portions 44 through which the arms 36 of the coil spool 3 pass are formed in the detection-side end portion of the circumferential wall 43.

Figure 5:
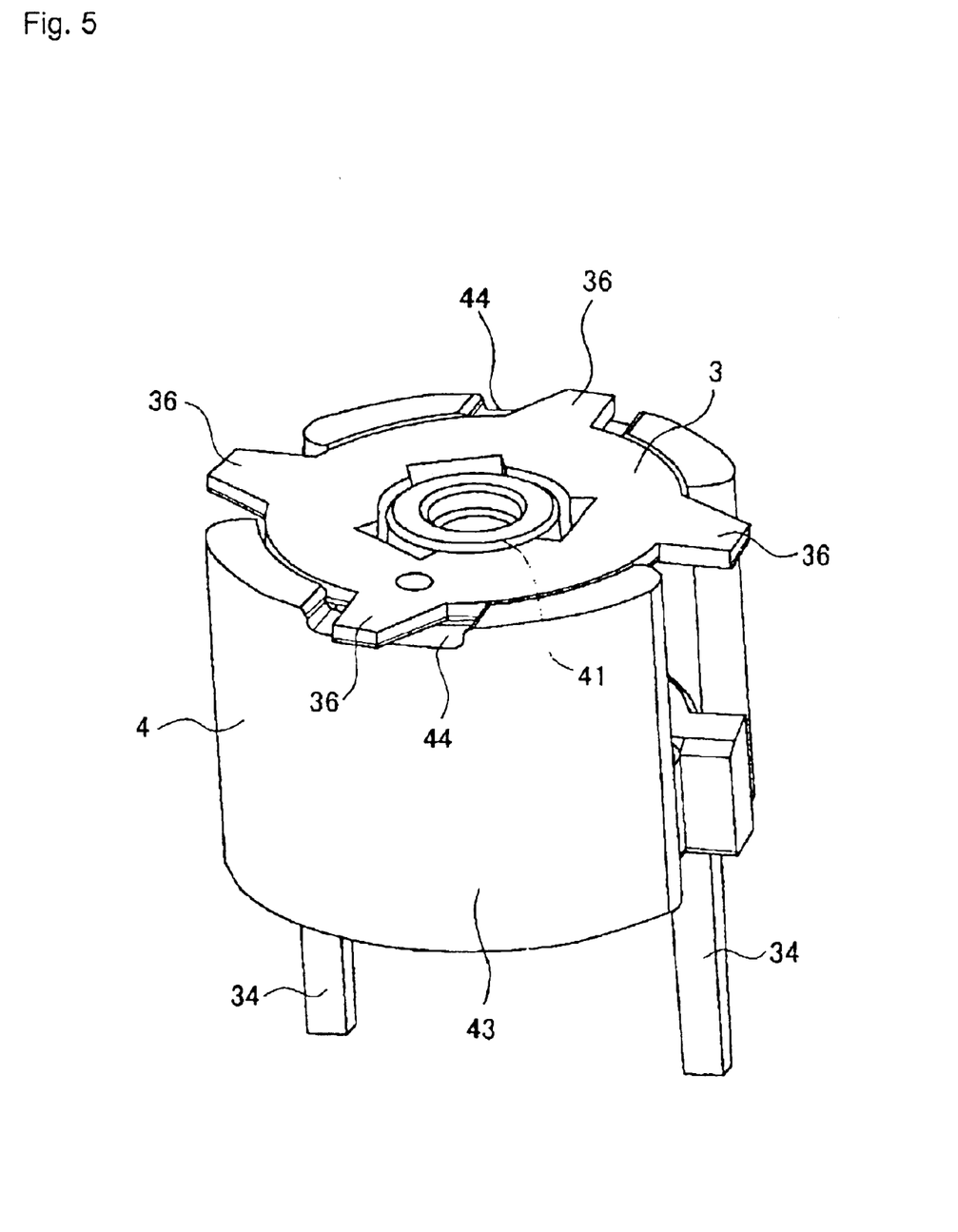
FIG. 5 is a perspective view showing a state where the coil spool and the core are combined with each other.

FIG. 5 shows a state where the coil spool 3 is combined with the core 4. Prior to the combination of these members, a lead wire is wound around the coil spool 3 to form a detection coil 1. The shaft 41 of the core 4 is inserted into the coil spool 3, so that the circuit-securing pins 34 of the coil spool 3 protrude from two gaps between the two circumferential walls 43 and the corresponding recessed portions of the base 42.

Herein, the circle that inscribes three protrusions 35 of the coil spool 3 is coaxial with the center axis of the coil spool 3, and its diameter is set to be slightly smaller than the diameter of the shaft 41 of the core 4 at the portion 35a as compared with the vicinity of the center in the axial direction of the coil spool 3. On the other hand, at the portion 35c (slope face) on the circuit side from the vicinity of the center in the axial direction of the coil spool 3, the diameter of the circle that inscribes the three protrusions 35 is gradually increased toward the circuit side to a diameter that is greater than the diameter of the shaft 41 of the core 4. Accordingly, the shaft 41 of the core 4 is in a press-inserted state with the protrusions 35 of the coil spool 3 being elastically deformed outward; thus, since the protrusion 35 apply a force to the shaft 41 evenly from three directions with equal distance, the coil spool 3 and the core 4 are coaxially positioned. Moreover, the protrusions 35 apply a force to the shaft 41 from the entire portion 35a on the detection side from the vicinity of the center in the axial direction of the coil spool 3, so that it is possible to prevent the axis of the coil spool 3 and the axis of the core 4 from tilting mutually.

The assembling is carried out in such a manner that the detection-side end face of the coil spool 3 and the detection-side end faces of the circumferential walls 43 of the core 4 are located on the same plane. In addition, the depth of each of the concave portions 44 of the circumferential walls 43 is set to be the same as the thickness of each of the arms 36 of the coil spool 3, or slightly greater than the thickness thereof; therefore, after the combination of the coil spool 3 with the core 4, even when an unnecessary force is externally applied thereto before these are solidified with resin, it is possible to prevent the coil spool 3 from shifting toward the circuit side with respect to the core 4.

It is noted that the positioning in the axial direction may be carried out not by locating the detection-side end face of the detection-side flange 32 and the detection-side end faces of the circumferential walls 43 on the same plane, but by bringing the arms 36 into contact with the concave portions 44.

Figure 6:
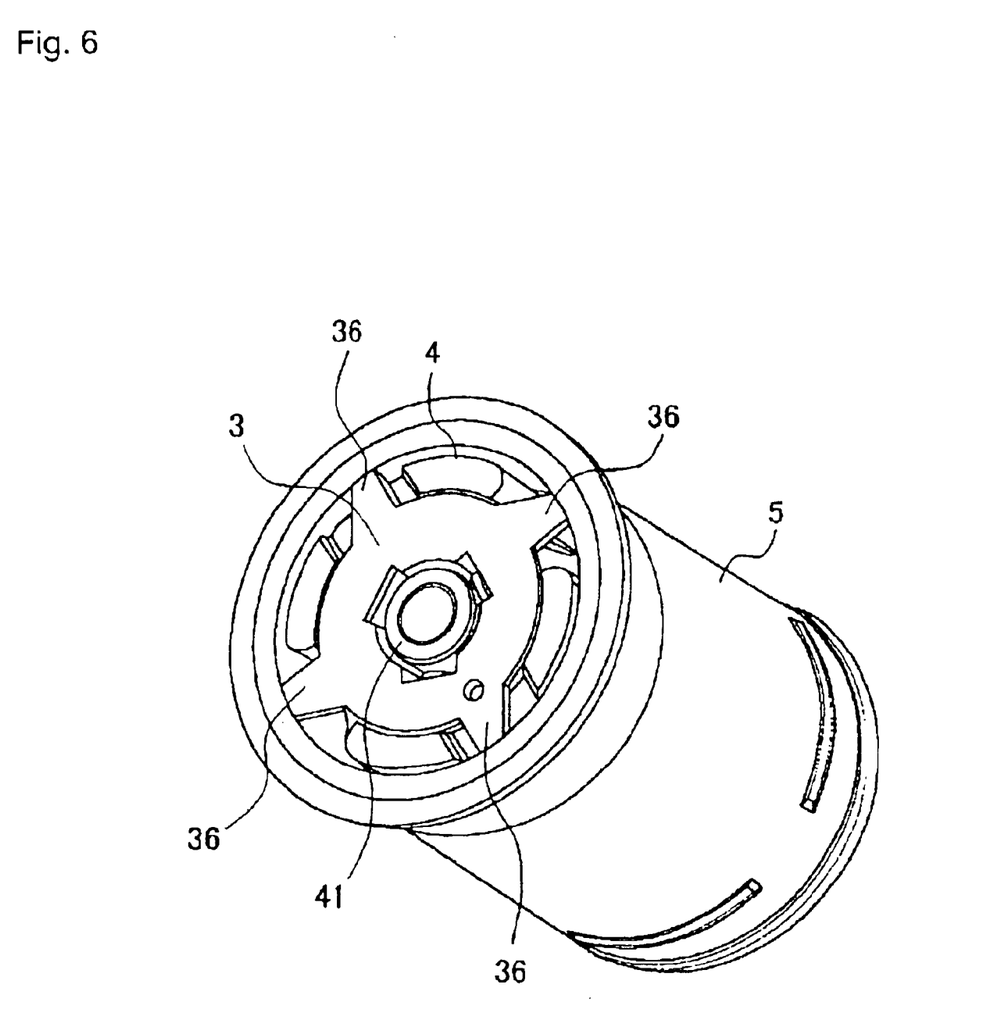
FIG. 6 is illustrates a state where the coil spool and the core are housed in a coil case, with a bottom face of the coil case being removed.
Figure 7:
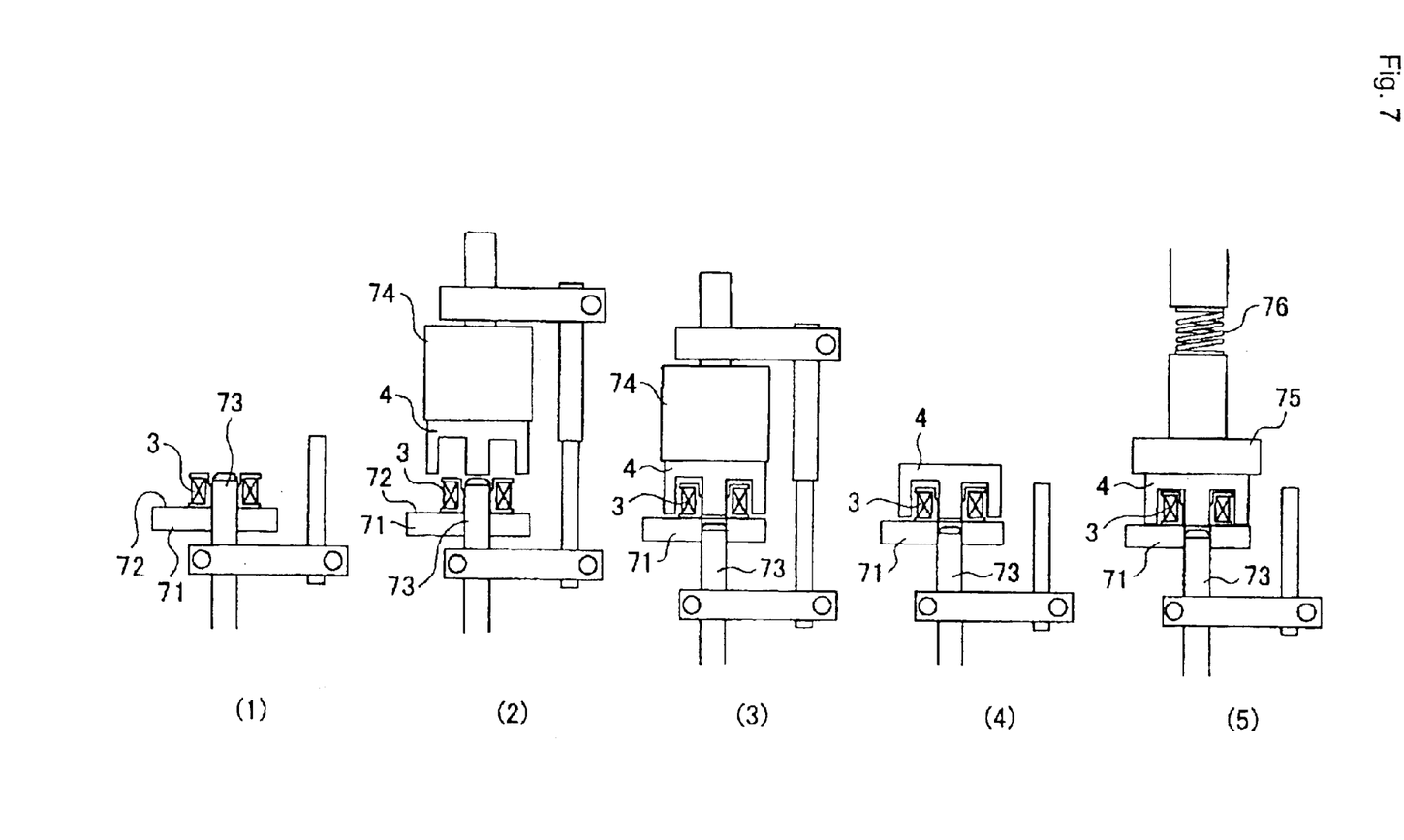

FIG. 6 shows a state where the coil spool 3 and the core 4 are housed in the coil case 5 with the bottom face 51 of the coil case 5 being not shown. The tip of each of the four arms 36 of the coil spool 3 is fitted to the inner face of the cylindrical coil case 5. The detection-side end face of the coil spool 3 and the detection-side end face of the core 4 are butted against the inner face of the bottom face 51 of the coil case 5.

With the above-described structure, the main body case 6, the coil case 5, the coil spool 3 and the core 4 are mutually positioned with high accuracy. More specifically, the coil case 5 is press-inserted to the main body case 6 so as to be located coaxially, and is also positioned in the axial direction by butting the detection-side end face of the main body case 6 and the ring 52 of the coil case 5 against each other. The coil spool 3 is located coaxially with the coil case 5 by fitting the arms 36 to the inner face of the coil case 5, and is also positioned in the axial direction by butting the detection-side end face of the coil spool 3 against the bottom face 51. The core 4 is located coaxially with the coil spool 3 by allowing the three protrusions 35 to bring into contact with the shaft 41 from three directions while being elastically deformed, and these two members are assembled so that the detection-side end faces thereof are located on the same plane, and thus positioned in the axial direction.

Referring to FIGS. 7(1) to 7(5), description will be specifically given of an assembling method of the coil spool 3 and the core 4. In this assembling, used are a mounting base 71 with its upper face serving as a reference plane 72, and a pilot pin 73 which penetrates through a hole provided in the mounting base 71 and reciprocally moves in the vertical direction (upward and downward direction) with respect to the reference face 72 of the mounting base 71. The diameter of the pilot pin 73 is designed to be slightly greater than the diameter of the shaft 41 of the core 4. As shown in FIG. 7(1), with the detection-side flange 32 of the coil spool 3 facing the reference plane 72 of the mounting base 71, the pilot pin 73 protruding from the mounting base 71 is inserted into the wire-winding drum 31 of the coil spool 3.

As shown in FIG. 7(2), next, the core 4 is held by a vacuum chuck 74 and placed above the coil spool 3. Then, the pilot pin 73 is lowered to pull out the coil spool 3 and the shaft 41 of the core 4 is inserted into the coil spool 3 so as to be exchanged with the pilot pin 73. With this manner, since the pilot pin 73 having a diameter greater than the diameter of the shaft 41 of the core 4 has already pushed and widened the three protrusions 35 of the coil spool 3, it is not necessary for the shaft 41 to further push and widen the protrusions 35. Accordingly, upon insertion, the shaft 41 is less susceptible to chipping and generation of dusts due to abrasion of the surface of the shaft 41. Herein, the slope face of each protrusion 35 of the coil spool 3 guides the insertion of the shaft 41.

FIG. 7(3) shows a state where the insertion of the core 4 held by the vacuum chuck 74 has been completed. The tip of the pilot pin 73 has been lowered to the same level as the reference face 72 or a level lower than the reference face 72, and the core 4 has not been brought into contact with the reference face 72 of the mounting base 71, so that there is a gap between the detection-side end face (lower end) of the core 4 and the reference face 72. This gap is prepared so as to prevent the core 4 from colliding with the reference face 72 to be damaged. Herein, the vacuum chuck 74 is taken out of the core 4 to be set in a state shown in FIG. 7(4) and, as shown in FIG. 7(5), finally, the core 4 is pushed into the coil spool 3 by a pusher 75 until the end face of the circumferential wall 43 of the core 4 brings into contact with the reference face 72, so that the end face of the coil spool 3 and the end face of the core 4 are located on the same plane. A pushing force given by the pusher 75 to the core 4 is controlled by a spring 76 attached to the pusher 75 to a degree so as not to damage the core 4. A plurality of kinds of strengths (pushing force of the pusher 75) of this spring 76 are prepared, and an optimal one is selected in accordance with the sizes and the like of the corresponding coil spool 3 and core 4. With the above-described processes, it is possible to obtain an assembly of the coil spool 3 and the core 4 that are positioned with high accuracy.

Figure 8:
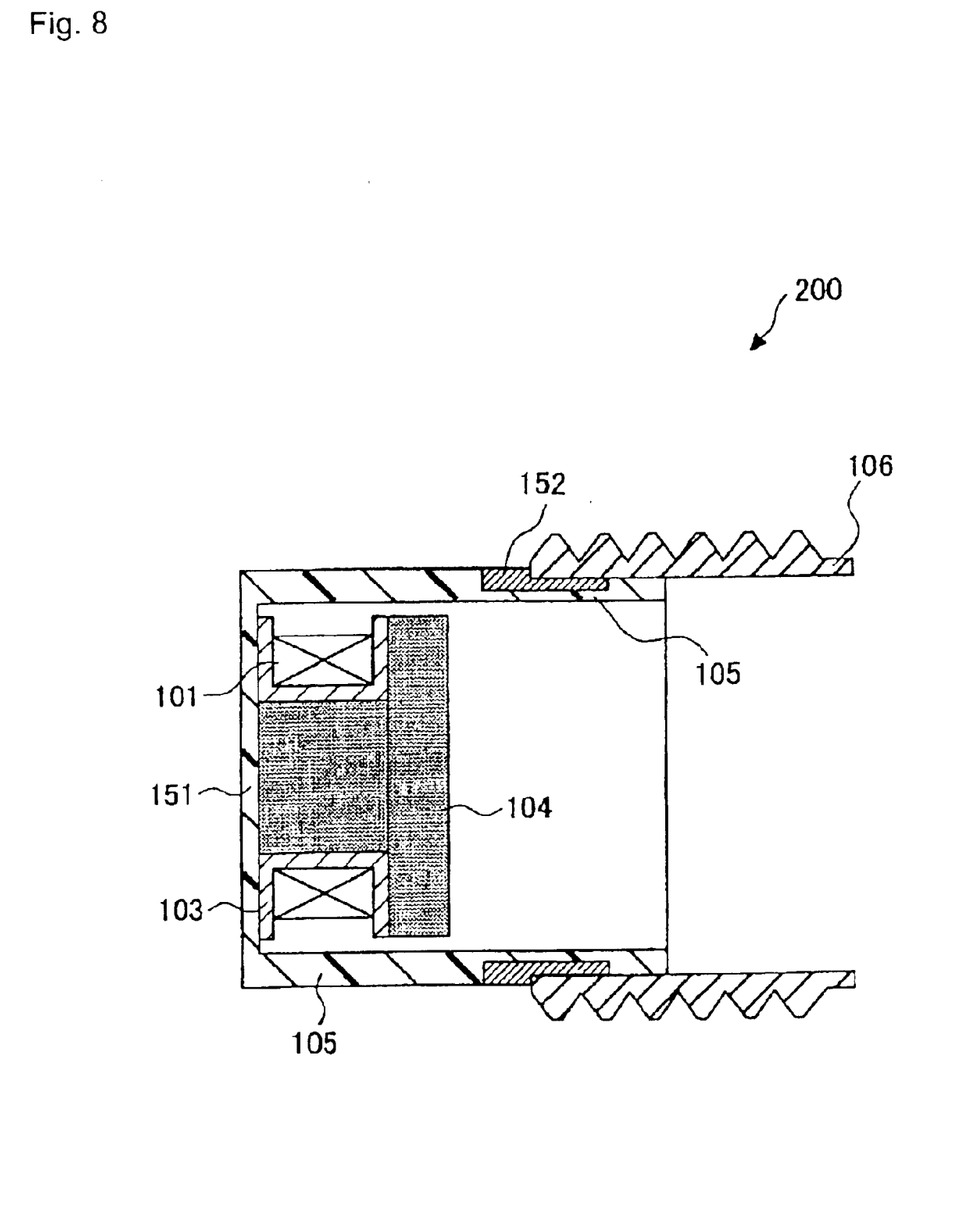
FIG. 8 illustrates a layout of members on the periphery of a detection coil in a proximity sensor according to another embodiment of the present invention.

Next, description will be given of an embodiment of a non-sealed type proximity sensor 200. FIG. 8 shows a layout of members on the periphery of the detection coil of a non-sealed type proximity sensor 200. FIG. 8 shows a detection coil 101, a coil spool 103, a core 104, a coil case 105, a ring 152 and a main body case 106 as the members. Different from the sealed type proximity sensor shown in FIG. 1, the non-sealed type proximity sensor has features in that the core 104 does not cover the outer periphery of the detection coil 101 (no circumferential walls of the core) and that the portion of the coil case 105, which houses the detection coil 101 and the core 104, protrudes from the main body case 106.

Figure 9:
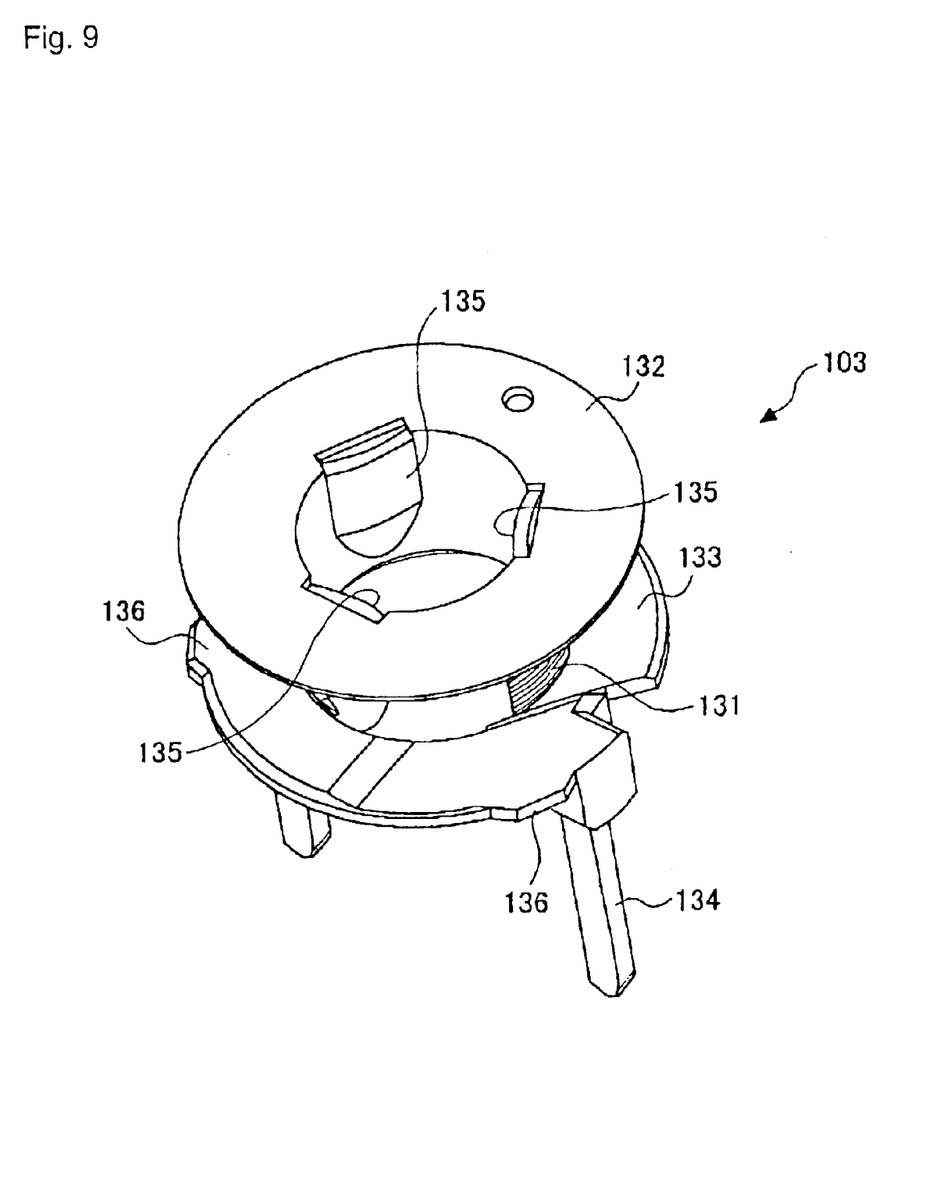
FIG. 9 is a perspective view of a coil spool.

FIG. 9 shows a perspective view of a coil spool 103. Similarly to the coil spool 3 shown in FIG. 2, the coil spool 103 includes a wire-winding drum 131, a detection-side flange 132, a circuit-side flange 133 and a circuit-securing pin 134, and a protrusions 135 are formed on the wire-winding drum 131. However, different from the coil spool 3 shown in FIG. 2, the coil spool 103 has a structure that no arms are formed in the detection-side flange 132 and convex portions 136 are formed at three portions on the outer periphery of the circuit-side flange 133. The diameter of a circle that circumscribes the tips of the convex portions 136 forms the greatest diameter of the coil spool 103, with the convex portions 136 being fitted to the inner face of the cylindrical portion of the coil case 105. The diameter of the detection-side flange 132 is smaller than the maximum diameter formed by the convex portions 136.

Figure 10:
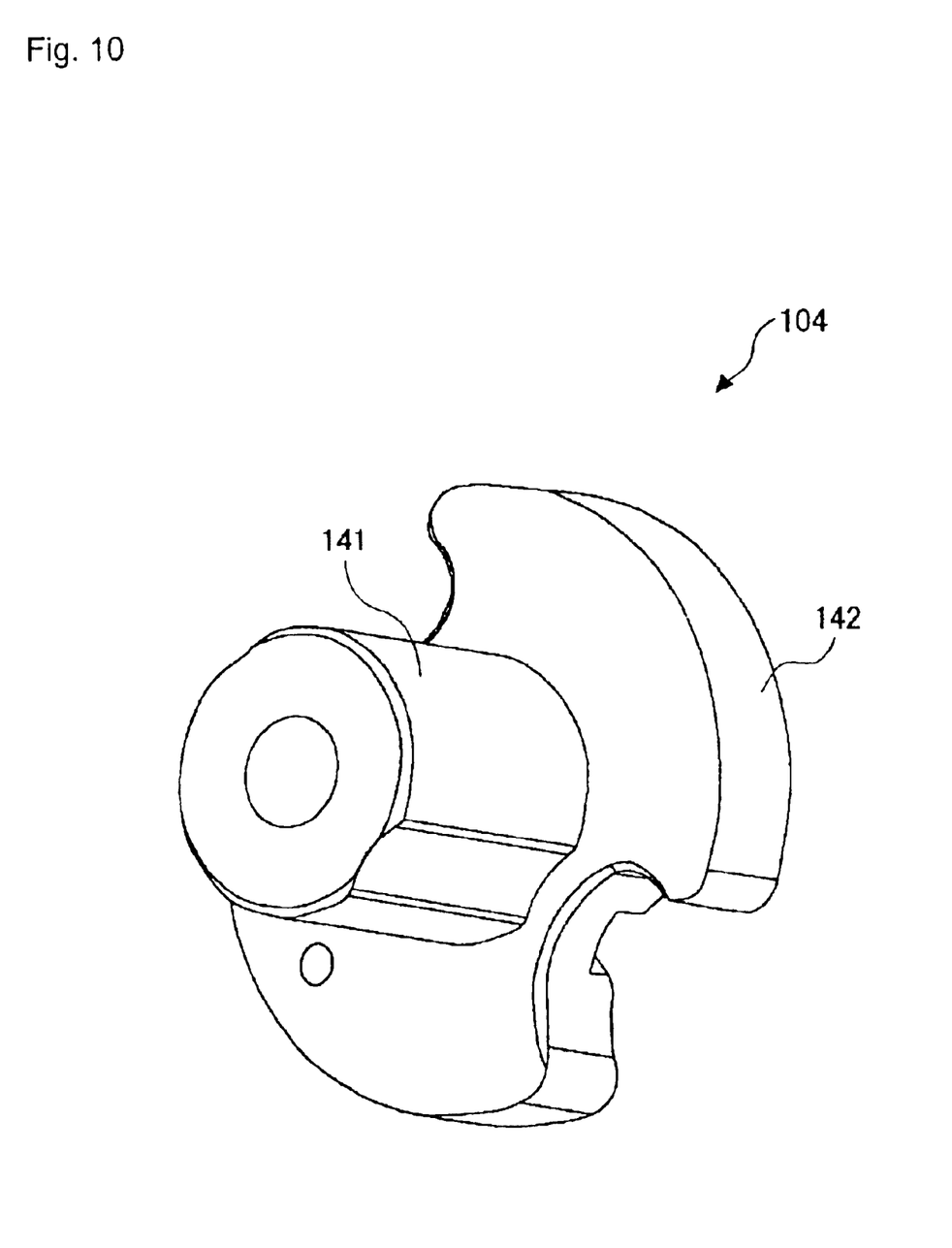
FIG. 10 is a perspective view of a core.

FIG. 10 is a perspective view showing the core 104. Similarly to the core 4 shown in FIG. 4, the core 104 includes a shaft 141 and a base 142, but includes no circumferential walls.

Figure 11:
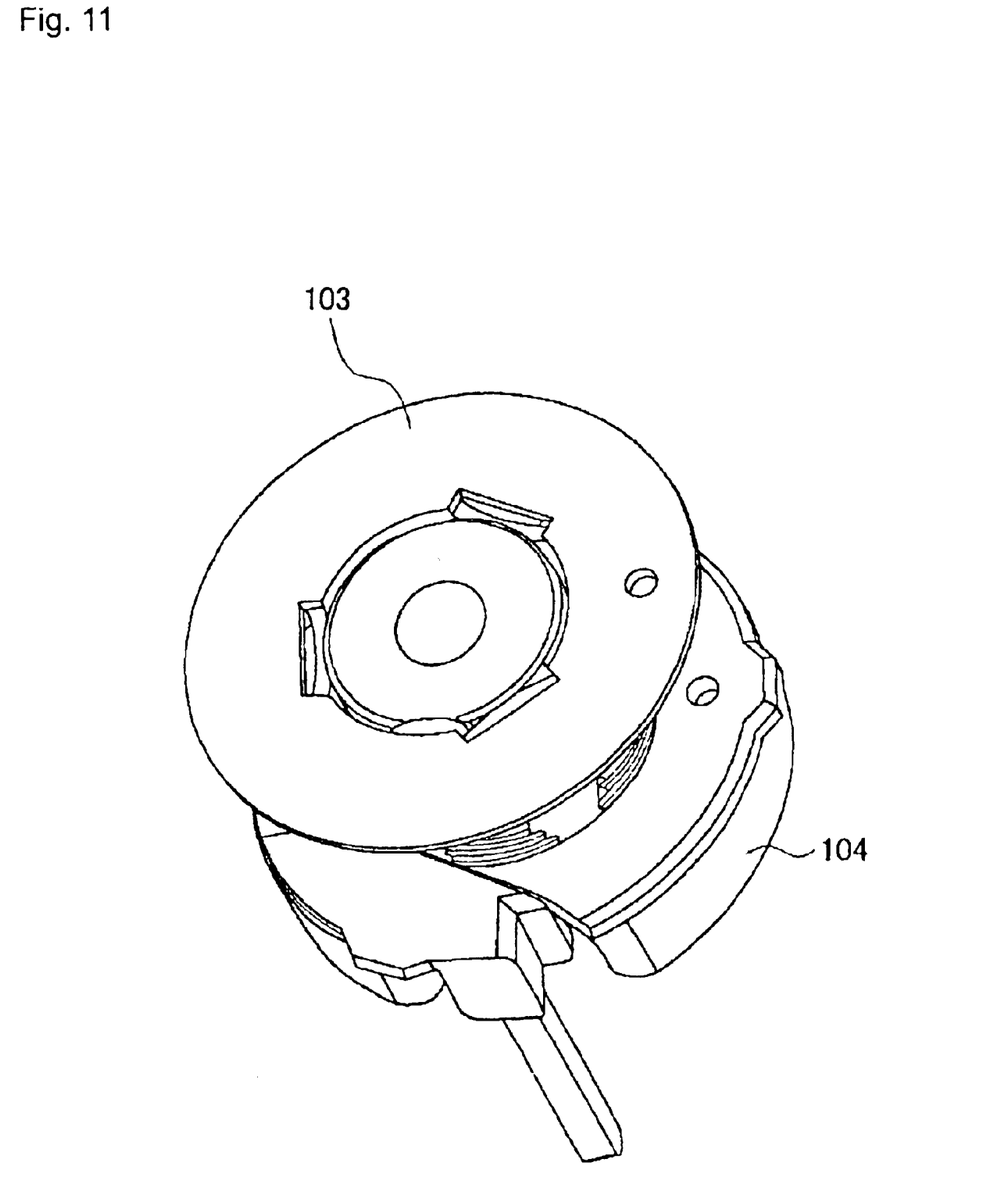
FIG. 11 illustrates a state where the coil spool and the core are combined with each other.

FIG. 11 shows a state where the coil spool 103 is combined with the core 104. The diameter of the circuit-side flange 133 from which the convex portion 136 of the coil spool 103 is removed is approximately the same as the diameter of the base 142 of the core 104. Similarly to the structure described referring to FIG. 5, the coil spool 103 and the core 104 are positioned coaxially with each other so that it is possible to prevent the axis of the coil spool 103 and the axis of the core 104 from tilting mutually. The detection-side end face of the coil spool 103 and the end face of the shaft 141 of the core 104 are assembled so as to be located on the same plane.

Figure 12:
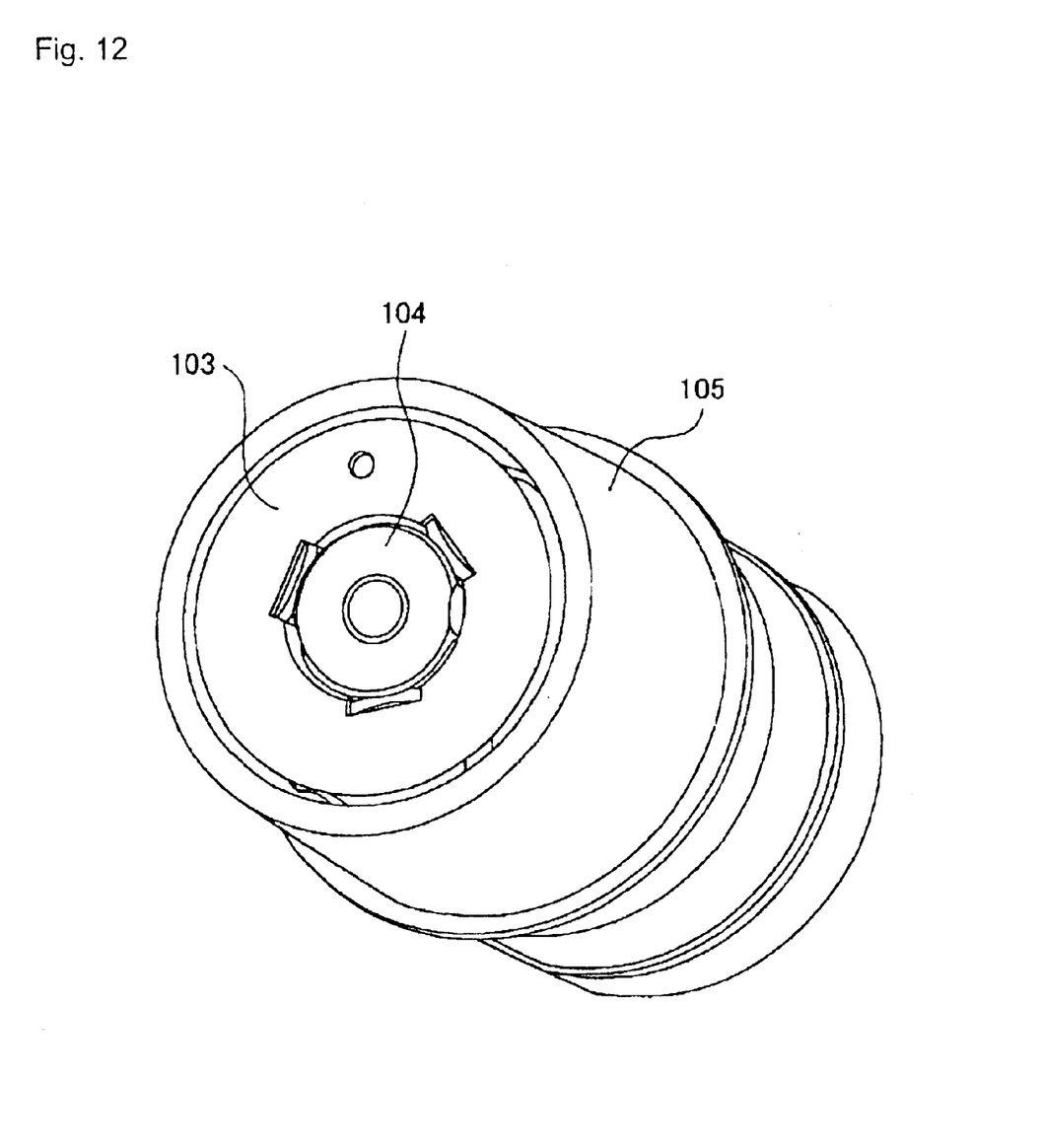
FIG. 12 illustrates a state where the coil spool and the core are housed in a coil case, with a bottom face of the coil case being removed.

FIG. 12 shows a state where the coil spool 103 and the core 104 are housed in the coil case 105 with the bottom face 151 of the coil case 105 being removed. Although not shown in this figure, the three convex portions 136 of the coil spool 103 are fitted to the inner face of the coil case 105. The detection-side end face of the coil spool 103 and the detection-side end face of the core 104 are butted against the inner face of the bottom face 151 of the coil case 105. As shown in the figure, since there is a gap between the outer periphery of the detection-side flange 132 and the inner face of the coil case 105, it is possible to easily insert the coil spool 103 and the core 104 into the coil case 105. In addition, there is a gap between the outer periphery of the circuit-side flange 133 and the inner face of the coil case 105 at a portion other than the convex portions 136; thus, a primary injection type resin is allowed to flow toward the detection end side through this gap.

A similar device shown in FIG. 6 is also used for assembling the coil spool 103 and the core 104. However, since no circumferential walls exist in the core 104, it is not possible to bring the tip of the circumferential wall into contact with the reference face 72; therefore, in states shown in FIGS. 7(3), 7(4) and 7(5), the height of the end face of the pilot pin 73 is preliminarily set to the same level as the height of the reference face 72 and, in the state shown in FIG. 7(5), the tip of the shaft 141 is brought into contact with the tip of the pilot pin, so that the positioning in the axial direction is carried out.

According to the present invention, the coil spool and the core are positioned so as to be located coaxially with each other, so that it is possible to provide excellent assembling workability.

What is claimed is:

1. A proximity sensor comprising:
   a detection coil;
   a detection circuit including an oscillation circuit having the detection coil as a resonance circuit element;
   a coil spool including a hollow cylindrical wire-winding drum around which a lead wire of the detection coil is wound, a detection-side flange provided on a detection side end of the wire-winding drum, and a circuit side flange provided on the detection circuit side end of the wire-winding drum;

a core, made of a magnetic member, including a shaft inserted into the wire-winding drum of the coil spool, and a plate-shaped base located between the coil spool and the detection circuit;

a cylindrical coil case housing the coil spool and the core and having a bottom on the detection side end; and a main body case, fitted to the coil case, for housing the detection circuit, wherein the wire-winding drum of the coil spool includes protrusions that protrude toward the center from not less than three points distributed in the range exceeding a semi-circle on the circumference of the wire-winding drum and that are elastically brought into contact with a shaft of the core, respectively, thereby coaxially positioning the coil spool and the shaft of the core.

2. The proximity censor according to claim 1, wherein each of the protrusions of the coil spool has a shape that applies a force to the shaft of the core at positions that are dispersed along the axial direction.

3. The proximity censor according to claim 1, wherein:

the core further includes a circumferential wall covering the outer periphery of the detection coil, and the detection-side flange of the coil spool and the inner face of the cylindrical portion of the coil case are fitted to each other.

4. The proximity censor according to claim 3, wherein the detection-side flange of the coil spool has an arm protruding from the outer periphery thereof, the arm fitting to the coil case, the circumferential wall of the core has a concave portion with a depth corresponding to the thickness of the arm, and the arm is allowed to pass through the concave portion.

5. The proximity censor according to claim 1, wherein the circuit-side flange of the coil spool is fitted to the inner face of the cylindrical portion of the coil case, with the detection-side flange of the coil spool having a gap-fitting state with a margin to the inner face of the cylindrical portion of the coil case.

6. A detection-end module for use in a proximity sensor, comprising:

a detection coil;

a detection circuit assembly including an oscillation circuit having the detection coil as a resonance circuit element;

a coil spool including a hollow cylindrical wire-winding drum around which a lead wire of the detection coil is wound, a detection-side flange provided on a detection side end of the wire-winding drum, and a circuit side flange provided on the detection circuit side end of the wire-winding drum; and a core, made of a magnetic member, including a shaft inserted into the wire-winding drum of the coil spool, and a plate-shaped base located between the coil spool and the detection circuit;

a cylindrical coil case housing the coil spool and the core and having a bottom on the detection side end, the members being integrally formed therein, wherein the wire-winding drum of the coil spool includes protrusions that protrude toward the center from not less than three points distributed in the range exceeding a semi-circle on the circumference of the wire-winding drum and that are elastically brought into contact with a shaft of the core, respectively, thereby coaxially positioning the coil spool and the shaft of the core, and the detection circuit assembly is designed so as to externally output a signal having a predetermined shape corresponding to the oscillation state of the oscillation circuit as an object detection signal of the proximity sensor.

7. An assembling method of a coil spool and a core for use in a proximity sensor, the coil spool including a hollow cylindrical wire-winding drum around which a lead wire of the detection coil is wound, a detection-side flange provided on a detection side end of the wire-winding drum, and a circuit side flange provided on the detection circuit side end of the wire-winding drum, the wire-winding drum including protrusions that protrude toward the center from not less than three points distributed in the range exceeding a semi-circle on the circumference of the wire-winding drum and that are elastically brought into contact with a shaft of the core, respectively, thereby coaxially positioning the coil spool and the shaft of the core, the core, made of a magnetic member, including a shaft inserted into the wire-winding drum of the coil spool, and a plate-shaped base located between the coil spool and the detection circuit, the method using a mounting base having a reference face and a pilot pin capable of reciprocally moving through the mounting base in order to assemble the coil spool and the core, and comprising the steps of:

inserting the pilot pin protruding from the mounting base into the wire-winding drum of the coil spool in such a manner as to direct the detection-side flange of the coil spool toward the reference face of the mounting base;

pulling out the pilot pin from the coil spool while bringing the detection-side flange of the coil spool into contact with the reference face of the mounting base and, also, inserting the shaft of the core into the coil spool in place of the pilot pin; and determining a relative position of the coil spool and the core by bringing the detection-side end face of the core into contact with the reference face of the mounting base.

* * * * *